Dec. 7, 1965 H. E. PARKER ETAL 3,222,442

METHOD OF CASTING ELECTRICAL COMPONENT MOUNTING BOARDS

Original Filed Jan. 14, 1960

INVENTORS
H.E.PARKER
R.A.SULLIVAN
R.R.WHIPPLE
BY A. J. Nugent
ATTORNEY 3,222,442
METHOD OF CASTING ELECTRICAL COMPONENT MOUNTING BOARDS Herbert E. Parker, Newburyport, Richard A. Sullivan, Danvers, and Richard R. Whipple, Haverhill, Mass., assignors to Western Electric Company, Incorporated, New York, N.Y., a corporation of New York Original application Jan. 14, 1960, Ser. No. 2,376, now Patent No. 3,076,230, dated Feb. 5, 1963. Divided and this application Oct. 5, 1962, Ser. No. 228,548
1 Claim. (Cl. 264—277)

This application is a division of application Serial No. 2,376, filed January 14, 1960, now Patent 3,076,230. The invention relates to methods for casting boards with mounted electrical components. Particularly, it relates to methods for casting plastic boards with electrical components set therein in which the leads of the electrical components protrude beyond the boundaries of the cast material.

A need for a method of the type mentioned above exists in the electronic circuitry art. As is well known, printed circuit techniques are widely applied to the economical mass production of electronic circuitry. Frequently, circuits of this type involve supporting electronic components (resistors, capacitors, inductors, and the like) on insulating plastic boards. The bodies of the components are on one side of the insulating board, terminals supporting the components extend through the board, and conducting paths on the other side of the board appropriately interconnect the terminals of the components. Usually the boards with the printed circuitry are prepared prior to installation of the components by methods well suited to large scale production which may involve, for example, photographic or silk-screen masking of copper sheets attached to the plastic boards and subsequent etching. Necessarily, the components are added after the circuit forming step by inserting the component terminals through holes drilled or punched in the board.

These methods become economically prohibitive when small quantities of one circuit are required. The reasons for this are well understood by practitioners in the art and relate in part to the economics of photographic or silk-screen etching. Several methods have been devised which are appropriate for the production of relatively small numbers of units. These employ one of several techniques for securing electrically conductive material between the leads of components previously rigidly set in a plastic matrix. Each of these methods improves on conventional wiring speeds but requires as a starting point a component strip with components consistently placed in an insulating matrix and having substantially clean exposed electrical terminals. The economic feasbility of these methods is depedent on developing a casting technique which is inexpensive and easily adaptable to changes in component configuration. It will be realized that apparatus appropriate for achieving advantages in the electrical applications may also be used for non-electrical castings in which articles are held during the casting step in fixed relation to each other by external supports.

Components cast in insulating material also are advantageous in the large scale production of electrical circuitry. Inevitably, large volume production leads to the use of automatic machines programmed to accomplish repetitious steps. Adaption of such machines to inserting components in conventional printed wiring boards, however, is a difficult and expensive task. Rapid relative positioning of the printed board and the component leads with sufficient accuracy to permit insertion of the leads into closely fitting prepunched holes poses considerable problems. Furthermore, a compromise is necessary between, on one band, oversized holes necessary for easy insertion of the leads, and on the other hand, close tolerances necessary for rigid support of the components. Utilization of cast component boards eliminates the disadvantages inherent in this compromise as well as many of the design limitations for the automatic machine. The techniques of the invention to be described permit considerably more latitude in positioning than is practical in printed boards but nevertheless provide the tightest possible contact between the component leads and the insulating material. The benefits of ease of positioning and improved support accompanying these techniques apply equally to small and large scale production. Another benefit not limited by the size of the run is that the close contact between leads and board material prevents damage to heat sensitive components such as transistors and diodes during subsequent soldering operations by providing a heat sink in the cast board.

Techniques are known for the plotting or encapsulation of electronic circuitry, but these are inappropriate for the uses discussed above and analysis of their purposes demonstrates this inadequacy. It may be necessary, for instance, to provide a mechanically secure environment for a circuit, perhaps to protect it from vibrational or accelerational stresses; it may be desirable to provide a proper electrical environment in which dielectric or magnetic permeability properties are fixed; or it may be desirable to supply single potted plug-in type units which are easily removed and replaced for servicing. For each of these purposes, the circuitry is cast within the potting material and is necessarily interconnected prior to potting. When economic considerations dictate that the casting step precede the wiring step, it is evident that these known encapsulating methods and associated apparatus must be considerably modified.

With these considerations in mind, it is an object of the invention to provide a simple and economical method for molding a support for articles to be potted or encapsulated in a predetermined relationship with each other.

Further, it is an object of the invention to provide a method of retaining items which are to be cast in fixed relationship with each other so that portions of the elements protrude from the casting.

For electrical components retained in cast strips, it is an object to provide a casting form which provides clean exposed electrical terminals on one side of a cast board and supports electrical components exposed on the opposite side of the cast board.

To achieve the above objects, the inventors provide a method which utilizes a mold, such as that disclosed in our co-pending parent application Serial No. 2,376, filed January 14, 1960, now Patent 3,076,230. The mold includes upper and lower mold sections for maintaining articles to be cast in fixed relation. The lower mold section holds a solid pierceable material which is capable of being punctured by extensions of the electrical components to be cast and is also capable of holding them in fixed relationship to each other during the casting operation.

In one specific embodiment of the invention, assurance that the extensions of the articles to be cast into the solid pierceable material will not be coated by mold material is provided by a thin pierceable sheet which is impermeable to the casting material and which covers the solid pierceable material. In one aspect of the invention, this thin sheet may be of paper and have indications thereon of the locations at which the extensions of the articles to be cast are to pierce the sheet and the solid pierceable material underneath.

In these embodiments, the upper and lower mold sections may be made of a moldable plastic which has a lower heat capacity than metal in order to expedite the curing of certain casting resins particularly of the cold cast type.

These and other aspects of the invention will be better understood from the following detailed description of one embodiment of the mold as utilized by the method according to this invention which is described in connection with the accompanying drawing, where:

Figures 1, 2:
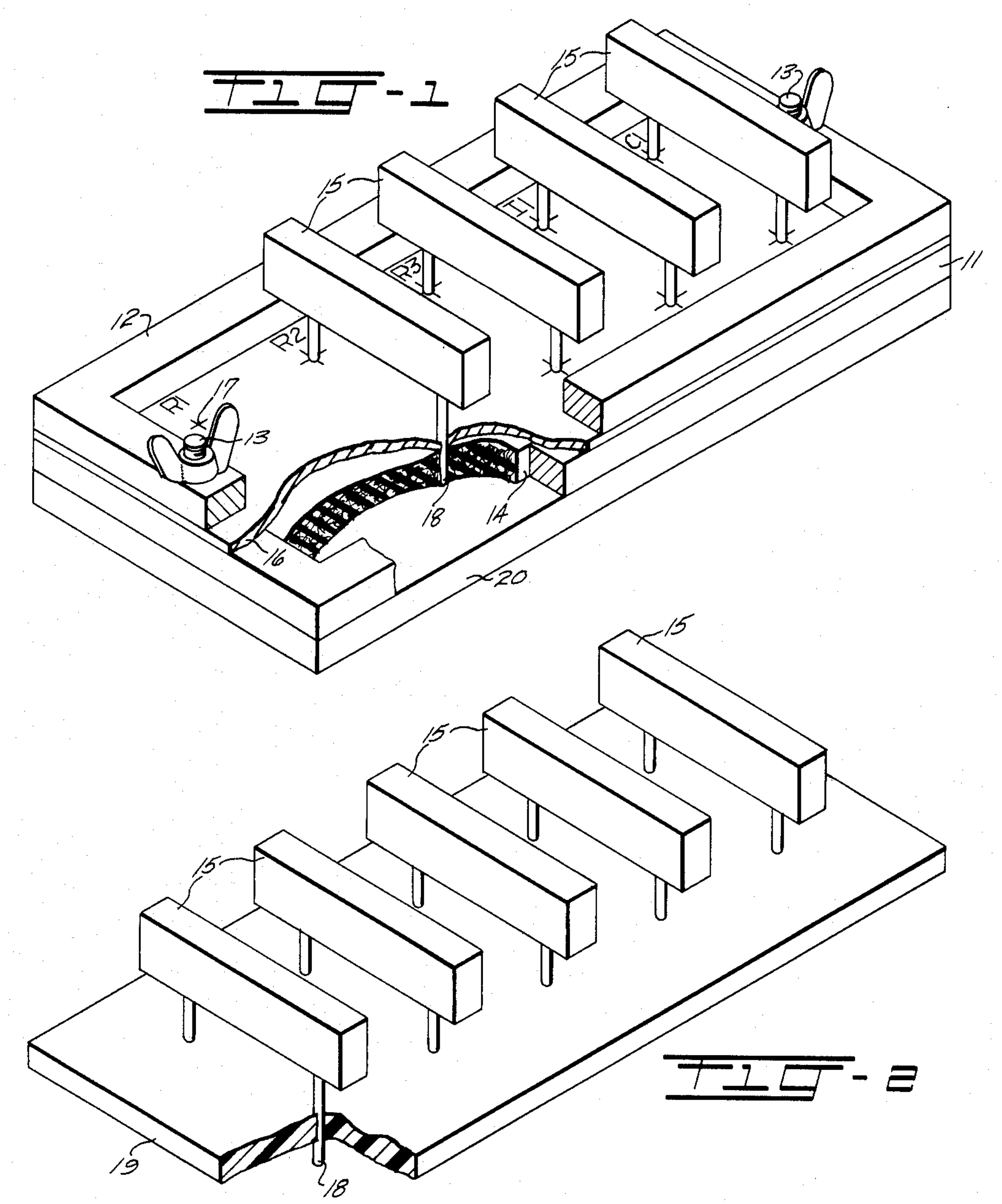
FIG. 1 is a partially cut away perspective view of a casting mold for electrical components according to one embodiment of the invention.
FIG. 2 is a perspective view of a casting produced in the mold of FIG. 1.

FIG. 1 shows an embodiment of the mold particularly well suited for the method according to this invention for casting of electrical components 15 of the type shown in FIG. 2. The mold consists of lower mold section 11 and upper mold section 12 maintained in a clamplike relation by screw and wing-nut arrangements 13. The inner face of each side of upper mold section 12 may have a 3 to 5 degree taper to facilitate removal of the cured casting. When fastened together, the lower and upper mold sections 11 and 12, respectively, comprise a simple open box-type mold appropriate for the casting of cold pouring plastics such as epoxy resins. The lower mold section 11 retains a pierceable solid layer 14 in the space bounded by its inner walls and supported by a base plate 20. The layer 14 is easily pierceable by elongated terminals 18 of the components 15 yet remains undeformed in the locations adjacent to the piercing terminal so that support is afforded the intruding body. Such a material appropriate for the support of electrical components having small weight is polystyrene resin foam which is inexpensive and easily handled. One commercial form is known as "Styrofoam." This material has a cellular structure, the individual walls of which may fracture under stress without there being, so to speak, a chain reaction of failure. A relatively small stress, for example one concentrated at the end of a component terminal 18 being pushed into the layer 14, will cause a substantially clean hole to be made therein. The undamaged walls of the cells immediately adjacent those destroyed during the piercing action have sufficient strength to support the electrical components 15 during the casting process.

There is the possibility, depending on the nature of the pierceable material selected, that casting material poured directly upon the supporting layer 14 will leak into its surface. Such an effect is most likely to occur when the supporting layer 14 is of a permeable or porous nature, that is, if adjacent cells are interconnected by passageways, and the viscosity of the poured casting material is low. When these conditions exist, it is apparent that an irregular, stalactite-like, casting surface will result. This effect may interfere with those uses to which the cast board may be put which require a smooth bottom surface. Also, these "stalactites" may clinch over portions of the supporting material cell walls and make difficult the separation of the cured casting from the mold. If the casting is an electrical component strip, an especially undesirable effect may result from the low viscosity casting material seeping through the pierced holes in the supporting layer 14 and solidifying along the portion of the terminal embedded in the supporting layer. This will interfere with the subsequent establishment of electrical connections.

In order to eliminate these deleterious effects, it is proposed as a feature of the invention that a thin, pierceable, impermeable covering sheet 16 should be clamped between the lower and upper mold sections 11 and 12 respectively, over layer 14. Sheet 16 may advantageously be of paper when the casting material is an epoxy resin. Prior to the insertion of the electrical terminals of the components 15, the top of sheet 16 as well as the exposed walls of upper mold 12 may be coated with a mold release substance so that after curing, the cast material will easily separate both from the mold 12 and the sheet 16. In certain uses, it may be beneficial for the sheet 16 to have indications 17 thereon showing the location of terminals or components. A paper sheet, of course, is particularly suitable as a medium for printed or drawn indications of this type. The necessity for locating jigs is thereby entirely eliminated.

The material for the lower and upper mold sections 11 and 12, respectively, may be one of several types depending upon the casting material and the curing methods used. If a large number of component strips are to be made in which the cast board dimensions are the same, it may be appropriate for the frames or mold sections to be of metal. In other situations, however, the mold sections may be made of some moldable plastic which is quickly and inexpensively formed. Selection of mold section plastic may be influenced by a desire to utilize a material of lower heat capacity than metal in order to expedite the curing of the casting material.

The physical geometry of the mold sections need not be limited to the arrangement of lower and upper mold sections 11 and 12 respectively, of FIG. 1. For example, an arrangement adaptable to different shapes is easily conceived and would be useful in situations where the geometry of the castings varies. It will be recognized that the pierceable solid layer 14 when made of "Styrofoam" is particularly well adapted to different casting sizes. The "Styrofoam" may be obtained in sheets which are easily cut to different sizes.

The inherent simplicity and economy of the method according to the invention is demonstrated by the steps necessary to produce the finished product shown in FIG. 2. In FIG. 2, 15 represents electrical components, as in FIG. 1, which may be of any type having terminals 18 passing through a supporting insulating board 19 of cured epoxy reisn. The first step in making the component strip is to place "Styrofoam" supporting layer 14 within the enclosure of the lower mold section 11. The lower mold section 11 and "Styrofoam" layer 14 are then overlaid with an appropriate paper sheet 16. Upper mold section 12 is then fastened by means of retaining members 13 to lower mold section 11 securely holding the paper sheet against the lower mold section. The top and inner walls of the upper mold section 12 and the top surface of the paper sheet 16 are then coated with mold release so that the casting material will be easily removed at the end of the curing process. The component leads or terminals 18 of components 15 are then forced into paper sheet 16 at the proper locations and through the "Styrofoam" 14 until they abut upon a supporting surface which may take the form of a base plate 20. Care must be taken in this insertion that the components are not moved laterally to cause oversizing of the supporting holes in the "Styrofoam." Properly inserted, the components 15 are held in position for the casting step by the "Styrofoam" layer 14. Cold casting epoxy resin is then dispensed into the mold until it fills the enclosure of the upper mold section. The epoxy is then cured, advantageously being carried to the curing station by a conveyor system. After the curing, the epoxy component strip is removed from the mold ready for attachment of electrical wiring to the exposed clean terminal ends 18. The entire mold frame assembly may be reused without change as long as the holes in the "Styrofoam" support do not become oversized or the cover sheet 16 damaged. It may be possible to reuse the "Styrofoam" support for other component strips having a different distribution of components but the same dimensions of cast board merely by separating the upper and lower mold sections and installing a new cover sheet 16.

The method of the invention has been described in only a single embodiment of the casting mold. However, it will be understood that various other manifestations of the invention fully within its scope and purpose will occur to practitioners of the art. For example, as has been previously stated, the method of the invention may advantageously find applicability to the casting of articles other than electrical components. A simpler arrangement of a mold other than the embodiment described may be useful for these purposes. A hollow-walled structure open at both the top and the bottom with the pierceable supporting structure establishing a floor upon which the molding material is poured can be easily adapted to a large variety of shapes. After curing, the casting can be easily removed by upward pressure on the supporting layer which would force the casting through the top opening.

What is claimed is:

The method of casting electrical component mounting boards which supports one or more components comprising:

positioning a frame about the periphery of a pre-formed base of polystyrene foam, said base and frame forming a temporary mold, locating a non-porous pierceable surface having indicia markings thereon on the polystyrene foam, forcing the terminals of one or more components through said indicia markings of the non-porous, pierceable surface and into the polystyrene foam base introducing an insulating casting material into the cavity defined by said temporary mold and about at least a portion of the terminals extending from polystyrene foam base, solidifying the insulating material to form a cast mounting board and to embed said portion of the component terminals therein, and removing at least the cast mounting board with said portion of the component terminals embedded therein from said polystyrene foam base and with said component terminal ends projecting a short distance from the bottom surface of the cast mounting board.

References Cited by the Examiner

UNITED STATES PATENTS

| | | | |
|---|---|---|---|
| 2,391,432 | 12/1945 | Marschner et al. | 18—59 |
| 2,837,855 | 6/1958 | Hoke. | |
| 2,850,826 | 9/1958 | Testa | 41—12 |
| 3,019,489 | 2/1962 | Burg | 18—59 |

ALEXANDER H. BRODMERKEL, *Primary Examiner.*

ROBERT F. WHITE, *Examiner.*